United States Patent
Pescarmona (10) Patent No.: US 11,348,014 B2
(45) Date of Patent: May 31, 2022

(54) SYSTEM METHOD AND APPARATUS FOR AI-BASED ADAPTIVE CONTROL OF HYDROLOGY MANAGEMENT FOR BASIN RIVERS

(71) Applicant: Lucas Pescarmona, Weston, FL (US)

(72) Inventor: Enrique Ménotti Pescarmona, Buenos Aires (AR)

(73) Assignee: Lucas Pescarmona, Weston, FL (US)

( * ) Notice: Subject to any disclaimer, the term of this patent is extended or adjusted under 35 U.S.C. 154(b) by 0 days.

(21) Appl. No.: 17/305,125

(22) Filed: Jun. 30, 2021

(65) Prior Publication Data

US 2021/0326715 A1    Oct. 21, 2021

Related U.S. Application Data (63) Continuation of application No. 16/384,156, filed on Apr. 15, 2019.

(30) Foreign Application Priority Data

Feb. 16, 2018    (AR) ............................ P20180100382

(51) Int. Cl.
   *G06N 5/02*    (2006.01)
   *G06N 3/02*    (2006.01)
   *G06F 30/28*    (2020.01)

(52) U.S. Cl.
   CPC ............... *G06N 5/02* (2013.01); *G06F 30/28* (2020.01); *G06N 3/02* (2013.01); *Y02A 10/40* (2018.01)

(58) Field of Classification Search
   CPC ................................... G06N 5/02; G06N 3/02
   See application file for complete search history.

(56) References Cited

U.S. PATENT DOCUMENTS

| | | |
|---|---|---|
| 6,474,153 B1 | 11/2002 | Yamanaka et al. |
| 6,947,842 B2 | 9/2005 | Smith et al. |
| | (Continued) | |

FOREIGN PATENT DOCUMENTS

| | | |
|---|---|---|
| CN | 102323970 A | 1/2012 |
| CN | 106384213 A | 2/2017 |
| | (Continued) | |

OTHER PUBLICATIONS

Sivapragasam, C., et al. "Monthly flow forecast for Mississippi River basin using artificial neural networks." Neural Computing and Applications 24.7 (2014): 1785-1793. (Year: 2014).*

(Continued)

*Primary Examiner* — Kevin W Figueroa
(74) *Attorney, Agent, or Firm* — Leber IP Law; David C. Robertson (57) ABSTRACT

Artificial intelligence-based watershed hydrology analysis and management having of a network of weather stations and artificial drainage systems with artificial and natural reservoir management through locks and pumping stations. Methods and systems evaluate hydrologic risk in each area and analyse the consequences of future precipitations using neural network assisted simulation. Hydrographs calculated for each sub-basin, streams and rivers in the basin simulates the behavior of the basin under different scenarios corresponding to different types of management of the operation of locks and/or pumps and compares its results in terms of loss of flooded area, economic loss in each area, loss for flooding of urban areas, etc. Optimization of the simulation by artificial intelligence meta-heuristic algorithms, multi-layered neural network acts as a search engine to find mitigation solutions and best configurations of resource management controls to minimize socio-economic impacts on each basin.

10 Claims, 7 Drawing Sheets

(56) References Cited

U.S. PATENT DOCUMENTS

| | | | |
|---|---|---|---|
| 7,136,756 B1 | 11/2006 | Vieux et al. | |
| 9,726,782 B2 | 8/2017 | Cordazzo et al. | |
| 2003/0078901 A1* | 4/2003 | Coppola, Jr. | G01V 9/02 706/21 |
| 2007/0143019 A1 | 6/2007 | Feyen et al. | |
| 2013/0317749 A1 | 11/2013 | Borger et al. | |
| 2017/0343702 A1 | 11/2017 | Radich et al. | |
| 2018/0165616 A1 | 6/2018 | Sun et al. | |

FOREIGN PATENT DOCUMENTS

| | | |
|---|---|---|
| CN | 107239607 A | 10/2017 |
| CO | 11043550 A2 | 4/2011 |
| JP | H 8-180109 A | 7/1996 |
| JP | 2002038456 A | 2/2002 |
| JP | 2002298063 A | 10/2002 |
| JP | 2004164591 A1 | 6/2004 |
| JP | 2007-524170 A | 8/2007 |
| JP | 4261278 B2 | 4/2009 |
| JP | 2011-154029 A | 8/2011 |
| JP | 2013-517547 A | 5/2013 |
| JP | 2015-4245 A | 1/2015 |
| KR | 101138098 B1 | 4/2012 |
| WO | 2016163129 A1 | 10/2016 |

OTHER PUBLICATIONS

Husain, "Flood routing in reservoir using modified Puls method", International Journal of Science and Research (IJSR), vol. 7, Issue 10, Oct. 2018, pp. 1187-1194.

Abbot; et al., "Input selection and optimisation for monthly rainfall forecasting in Queensland, Australia, using artificial neural networks", Atmospheric Research, vol. 138, Mar. 1, 2014, pp. 166-178.

Doycheva; et al., "Assessment and weighting of meteorological ensemble forecast members based on supervised machine learning with application to runoff simulations and flood warning", Advanced Engineering Informatics, vol. 33, Nov. 2016, pp. 427-439.

European Patent Application No. 19157720.4-1111, Intention to Grant dated May 4, 2021, 5 pages.

European Patent Application No. 19157720.4-1111, Search Report dated May 14, 2020, 7 pages.

Fleming; et al., "Development and Operational Testing of a Super-Ensemble Artificial Intelligence Flood-Forecast Model for a Pacific Northwest River", Journal of the American Water Resources Association, Apr. 2015, vol. 51, No. 2, https://doi.org/10.1111/jawr.12259. Disponible en:https://onlinelibrary.wiley.com/doi/abs/10.1111/jawr.12259, pp. 502-512.

Gill, "Flood routing by the Muskingum method", Journal of Hydrology, vol. 36, Issues 3-4, Feb. 1978, pp. 353-363.

Ju; et al., "Division-based rainfall-runoff simulations with BP neural networksand Xinanjiang model", Neurocomputing, vol. 72, Issues 13-15, available on line Apr. 8, 2009, pp. 2873-2883.

Kasiviswanathan; et al., "Methods used for quantifying the prediction uncertainty of artificial neural network based hydrologic models", Stochastic Environmental Research and Risk Assessment, vol. 31, No. 7, Dec. 8, 2016, pp. 1659-1670.

Kavzoglu; et al., "Landslide susceptibility mapping using GIS-based multi-criteria decisoin analysis, support vector machines, and logistic regression", Landslides, vol. 11, No. 13, Jun. 2013, pp. 425-439.

Nourani; et al., "Applications of hybrid wavelet—Artificial Intelligence models in hydrology: A review", Journal of Hydrology, vol. 514, ISSN 0022-1694, Mar. 24, 2014, pp. 358-377.

Patel; et al., "A Comparison of Machine Learning Techniques for Modeling River Flow Time Series: The Case of Upper Cauvery River Basin", Water Resources Management, Springer Netherlands, Dordrecht, Jun. 19, 2014, vol. 9, No. 2. pp 589-602.

Tang; et al., "Assessment of flood susceptible areas using spatially explicit, probabilistic multi-criteria decision analysis", Journal of Hydrology, vol. 558, 2018, Accepted for publication Jan. 12, 2018, ISSN 0022-1694, https://doi.org/10.1016/j.jhydrol.2018.01.033, (https://www.sciencedirect.com/science/article/pii/S0022169418300349), pp. 144-158.

Zaini; et al., "Application of computational intelligence methods in modelling river flow predictions: A review", 2015 International Conference on Computer Communications, and Control Technology, (I4CT), IEEE, Apr. 21-23, 2015, pp. 370-374.

Zhang; et al.; "Short-term water level prediction using different artificial intelligent models", 2016 Fifth International Conference on Agro-geoinformatics (Agro—Geoinformatics), IEEEE, Jul. 18, 2016, 7 pages.

U.S. Appl. No. 16/384,156, Non-Final Office Action dated Jan. 6, 2022, 22 pages.

Japanese Patent Application No. 2019-025512, English Translation of Decision to Grant A Patent draft Nov. 26, 2021, 2 pages.

* cited by examiner

SYSTEM METHOD AND APPARATUS FOR AI-BASED ADAPTIVE CONTROL OF HYDROLOGY MANAGEMENT FOR BASIN RIVERS

RELATED APPLICATIONS

This application is a continuation application of U.S. patent application Ser. No. 16/384,156, filed Apr. 15, 2019, which claims the benefit of priority to Argentina Patent Application P20180100382, filed Feb. 16, 2018, the entire contents of which are hereby incorporated by reference.

TECHNICAL FIELD

The present invention relates to systems and methods of hydrology management for basin rivers using Artificial Intelligence (AI) for watershed management employing digital networks of weather stations and artificial draining systems with management of natural and artificial reservoirs through locks and pumping stations. Specifically, the invention integrates the technical fields of Meteorology, Hydrology, Engineering, Process Control, Artificial Intelligence and Machine Learning, among others, for the mitigation of hydrometeorological events in geological, agricultural, and urban areas of a river basin.

BACKGROUND OF THE ART

Existing watershed hydrology analysis systems operate by analyzing results from atmospheric data, precipitation measurement through rain gages, humidity detectors, etc.; runoff, temperature, solar radiation measurement, and others; which are collected and processed to make predictions manually according to classical calculation techniques.

In some existing systems, data collection is performed by different governmental and private entities that separate meteorological and hydrological data. In some known systems, a single entity registers all measured data, whether meteorological or hydrological, as such is the case in the Unites States of America. However, even in single entity data collection systems, the computational forecasts available generate a reserved forecast that does not have an associated mitigation strategy. The forecast and the on line applications issue warnings on the hydrological event without addressing the socio-economic impacts of retained and released volumes of water flows of a basin area. The models developed in these systems incorporate data from the main urban and agricultural development variables to quantify potential losses. However, the reserved forecasts in the form of warnings distributed to stakeholders and solutions are implemented in isolation without optimizing the resources available in the corresponding watershed. Likewise, there are water management systems that do not have any intelligence associated to the forecasts received. In general, the implementation of such an integral system would require a significant number of well-trained personnel ready for critical decision-making during predicted or real time hydrometeorological events.

These known systems are based on mathematical models that make meteorological and watershed status predictions, usually as described below.

A watershed hydrology analysis system for networks with weather stations according to the current technology uses calculation models, especially the meteorological model and the basin model that is to be analyzed.

Meteorological models are necessary to estimate and extrapolate the precipitation that falls on each of the sub-basins from the data recorded by each rain gage. Meteorological information has two main sources: rain gages that report the quantity of accumulated water in time increments, and the output of the meteorological radar. Both sources must be calibrated and adjusted manually in the site in order to obtain a reliable hydrograph output.

Generally, this set of models simulate the three principal processes of a flood event, i.e. precipitation, infiltration, and surface runoff, obtaining in a short time information on flooded areas, flood levels of riverbeds, retained and released volumes; and other significant data. However, the current technology only receives information and does not remedy the existing problem of controlling the water flows according to the simulation, nor does it generate recommendations or coordinate actions or steps to be followed upon a prediction or real time measurement of a hydrometeorological event.

Known meteorological models evaluate precipitation over a determined area using the relative positioning of the rain gages that cover such area. These areas are called Thiessen Polygons (the range of each rain gage as half the distance between two consecutive gages). All the information is integrated into a single feedback sequence to be able to issue the alerts in the first place and to project the potential losses of structures or agricultural production.

The isohyets method, on the other hand, determines the lines of equal precipitation level.

Using both results, these known models calculate precipitation level, precipitation distribution over time, and precipitation distribution over a certain area following standard procedures and general recommendations. They provide information on the weather event yet cannot solve for the models and solutions available in the industry.

On the other hand, the basin model itself includes an outline of drainage surface, existing connections among different sub-basins, as well as the morphological properties of each sub-basin. This known watershed model also includes chosen calculation methods and their associated hydraulic parameters.

Runoffs are calculated in each sub-basin using the Soil Conservation Service (SCS) method which allows differentiating surface runoff from groundwater flow due to infiltration. Infiltration is a variable that changes according to the terrain characteristics, quantity of absorbed water, vegetation type, etc. Such changes require knowing geophysical characteristics.

A sub-basin hydrograph is obtained from the surface runoff. Each sub-basin has the rainfall to runoff ratio calibrated by the CN (Runoff Curve Number), which is the percentage between 0% and 100% of the absorption of water by the terrain. Also, the CN depends on the humidity conditions preceding the rainfall. There may also be a horizontal contribution from the groundwater flow which is dependent on the slope of the terrain and the porosity of the ground.

Evaporation and evapotranspiration are outflow variables. The former measures water quantity in millimeters over a unit of time of the evaporation that takes place in reservoirs or flooded areas. It is measured by a recording station with evaporation pans. The latter, instead, depends on the type of vegetation or crop, which could be an important strategy in this water balance to decrease the permanence time of flooding waters.

Then, the runoff is estimated, as well as the hydrograph from the sub-basin's surface to riverbeds and streams.

Adding the contribution of each sub-basin, the flow to riverbeds and reservoirs can be calculated using generally accepted calculation methods and industry codes.

Possible outflows may also be calculated, for example, using models known in the art based on equations such as Chezy/Manning which are inversely related to the Manning coefficient depending on terrain roughness/vegetation and which may take a value of between 0.013 for lined open channels and up to 0.045 for those with vegetation and directly proportional to the square root of the hydraulic radius of the open channel (calculated as the ratio between surface and wet perimeter) and the channel slope:

$$C = K\left[\frac{R^{0.125}}{n}\right]$$

where,
C=Chezy Roughness Coefficient $$\left[\frac{\sqrt{m}}{s}\right]$$

R=Hydraulic Radius [m]
n=Manning Roughness $$\left[\frac{s}{\sqrt[3]{m}}\right],$$

and $$K = \sqrt[3]{m/s}$$

Substituting the roughness calculated with Chezy's equation, Manning's equation is obtained:

$$Q = AR^{\frac{2}{3}}\sqrt{S}$$

where,
Q=Discharge [m³/s]
A=Area [m²]
S=Slope Friction [m/m]

Another variable used in the analysis system is the natural vertical outflow, which is the terrain seepage. This may depend on the type of terrain and its saturation level given by the phreatic level. The +PULS and the variance Modified PULS method is used and the Muskingum method relates the hydrograph at the inflow and outflow of each dam and reservoir, surplus flows, maximum levels of each reservoir, dimensions of surplus flow works and determination of the maximum extraordinary water level. In order to do this, the profiles of the natural riverbeds and artificial channels must be known, as well as the reservoirs bathymetric profile, so that the storage capacity and the area to reserved volume ratio can be determined. Therefore, these technology systems mainly depend on the reliability of previously acquired data.

In each part of the models developed for the present invention there are fixed coefficients and other variables that change over time, such as humidity, soil humidity, changes in the coefficient of evapotranspiration due to changes in crops, solar radiation, etc. The model has been set with these variables. Some of these variables are direct or indirect measurements. The current watershed model with many riverbeds and reservoirs may have hundreds of parameters depending on the size of the model's discretization.

A common aspect of the known systems of hydrology analysis is that they require a Control Room. In this Control Room, some data are known, such as water volumes and where surplus volumes should be directed to achieve flood control. In these rooms, teams of highly trained professionals will be able to make decisions and operate a system that allows preserving people's lives and the integrity of cities.

In the state of art, the U.S. Pat. No. 9,726,782 B2 Patent is also known. This patent seeks to solve similar problems implementing methods, systems and software storage devices to generate a response to flood events. For instance, with a redundant communication system in the event of failures of the main system, the patent does not have the generation of possible scenarios for analysis in decision-making, among other shortcomings as addressed by the present invention.

However, U.S. Pat. No. 9,726,782 B2 does not explain how to estimate of the hydrometeorological event or hydrographs are calculated and evaluated. Therefore, the method used does not describe the method of assurance to decrease error and increase precision.

Additionally, U.S. Pat. No. 9,726,782 B2 does not cover the integration of the control of mitigation reservoirs and the integral planning of the watershed, such as floodable areas, higher productivity lots, critical areas, etc. For that purpose, it does not use aerial or satellite imaging to estimate flooded areas, water volumes, soil quality and vegetation information, etc.

In summary, the state of the technology has not yet provided an intelligent system that may operate on-line with the tools of automated learning that might be used to provide feedback for predictions and dynamically adjust the event estimations and hydrologic models, wherein the system's continuous learning strengthens the decision making of future events depending on the continuous use of the system in order to solve problems quickly and to improve the situation of the population in the areas of implementation.

The technology state has not yet provided a system of hydrologic analysis and management that uses aerial and satellite images and radar to estimate flooded areas, water volumes, soil quality and vegetation information; nor an intelligent system that understands the potential energy generation within an integral plan taking advantage of artificial reservoirs in a distributed and optimized way with electrical pumps and pump-turbines.

SUMMARY OF THE INVENTION

This invention aims to provide a hydrological analysis and management system and process for watersheds with meteorological networks and artificial drainage systems with natural and artificial reservoir management by means of locks and pumping stations where the potential hydrological risk of each area is evaluated and the consequences of future precipitations are analyzed beforehand using simulations carried out using an Artificial Intelligence system where hydrographs for each sub-basin, streams and riverbeds within the basin at hand are calculated for each simulation and, afterwards, the behavior of the basin under different scenarios corresponding to different management of locks and/or pumps operations is simulated and the results compared against the surface loss due to flooded area, economic loss for each sector, losses due to flooding of urban areas, etc.; where the simulation optimization through Artificial Intelligence (meta-heuristic algorithms, neural networks, etc.) becomes the search engine to look for the best possible solutions and the best configuration of resource management to allow minimization of socio-economic impact within the watershed facing the hydrologic event.

Another goal of this invention is to supply a hydrology analysis and management system whose resolution comprises a mass balance created by the incoming and outgoing volumes that allows retaining such volume in each study cell into which the system is divided where said water volumes can be directed to a certain destination in order to achieve flood control in accordance with the selected protection criteria through a control room and decision-making process in which all information is quickly obtained and available on-line and from which the opening and closing of locks and operation of the available pumping stations for drainage control can be directed orderly.

Another goal of this invention is to provide a watershed hydrology analysis and management system process within which strategies could be formulated using Artificial Intelligence to protect villages and towns, the best productive areas, the best soils, and the strategic locations for watersheds thereby allowing water storage in unused land for the purpose of using it later in response to future drought and facilitating an important strategic byproduct as is the generation of electricity using advanced conversion systems (low-speed generators and run-of-the-river turbines) through the management of available water resources.

DETAILED DESCRIPTION OF THE INVENTION

The invention, in its preferred mode of implementation, entails a process and system of hydrology analysis and management using Artificial Intelligence (AI) for watersheds with networks of weather stations and artificial drainage systems with administration of natural and artificial reservoirs through locks and pumping stations that offer a real-time response to the problem during its occurrence, thereby optimizing flood control in the watershed to which the invention is applied. The term 'real time' should be understood as the response time of the system within the magnitude of the timing of the development of the meteorological phenomenon.

As described below, in some embodiments, implementation of the invention relates to two general subsystems: The software has two directly coupled modules. One that calculates the forecast of rain to fall in a spatial distribution of the terrain. Then, these projections are the input of the runoff model that calculates how the distributed rainfall contributes to each sector of the land, calculating the flows over it. Based on the flows, it is possible to estimate the possible areas impacted with the accumulated water levels (flooding). These data are validated with earth stations that allow adjusting the coefficients of the models. Depending on the water level per area, alerts are issued for each case.

The system can report and execute the following aspects:

Resource location.

Processing of information from the decision-making support subsystem to create a list of recommended actions in case of flood.

Provision of an action list in response to floods that include: communication of the recommendations message to every agent involved in the flood; evacuation of the population; securing of transport routes; securing of critical supplies; isolation of the affected infrastructure; dispatch of qualified personnel and equipment to key locations.

Continuous communication of executed actions and event progress.

Other objectives and benefits of the present invention are further described below.

The present invention combines methods from several disciplines. Through the analysis of meteorologic events and their hydrologic consequences, an integral hydrologic model that is capable of describing the hydrologic state of the watershed as well as predicting runoffs, flooding and drought, is trained. This model, composed of a large number of multi-parameter equations, calculates scenarios on the hydrologic state of the watershed for different weather forecasts. In this way, a large number of cases can be prepared before said forecast. Based on the occurrence of a certain meteorological event, the system automatically selects the calculated case that best describes measurements. Therefore, hydrologic prediction is available in a few hours.

The training of the assumed scenario results in watershed behavior curves. These curves are the system's transfer function (TF) between input (rain and actual state of the watershed) and output (scenario after the rain). It is a non-linear function that depends on hundreds of factors. Some of them are stochastic factors while others are deterministic factors that change depending on time, humidity, climate conditions, temperature, etc.

$$\text{BEHAVIOR CURVE} = f(\Sigma H, \Sigma E, \Sigma A, fNR \ldots)$$

The behavior curve is a complex linkage of hydrographs $H=f$ (surface, DEM, soil structures, etc.), runoffs $E=f$ (H, infiltration, soil humidity, etc.), and avenues $A=f$ (E, bathymetric profile), reservoir levels $NR=f$ (volume, inflow, outflow, evaporation) of each of the sub-basins, gauging, reserves and basins of the watershed; that is why the training of the expected scenario creates hundreds of curves.

In this way, when an event similar to the expected rain scenario takes place, the system instantaneously recognizes the expected behavior of the watershed. The hydrology analysis and management system is set to generate an early alert and warn the community. The information to be delivered may depend on the predictive conditions of each location in the watershed. It may be delivered to the stake holders by means of automated applications through mobile phones, electronic mail and smart or similar apps, together with a reservoir management control plan that may determine, as an example, to pump water from one sub-basin to the other.

While this is taking place, the operating state of the drainage system provides feedback to the expert system using the ground measuring stations, which continuously reclassify the analysis conditions in order to maintain the watershed mass balance through a set of sensors, instruments and computers which have a closed-loop communication system, i.e., pumping or closing/opening locks to direct water from one reservoir to the other.

Over time, databases are filled with additional information, trends and watershed behavior curves for different precipitation scenarios. Additionally, each behavior curve is calibrated with the variables of each sub-basin models. These parameters change over time, such as soil structure, crops, temperature, humidity, etc. This growing database feeds the systems assisted by AI to anticipate the system of deterministic and stochastic events.

Figure 4:
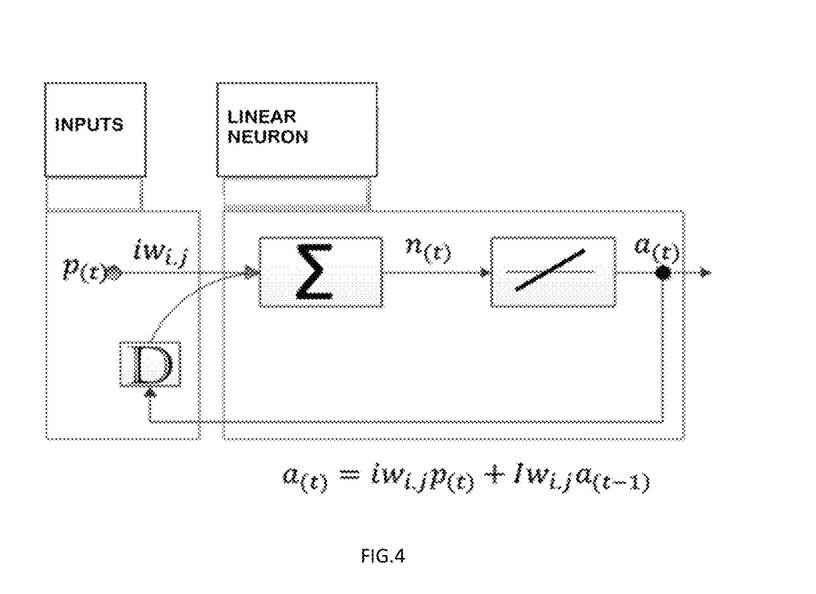
FIG. 4 represents a Lineal Recurrent Neural Network.
Figure 5:
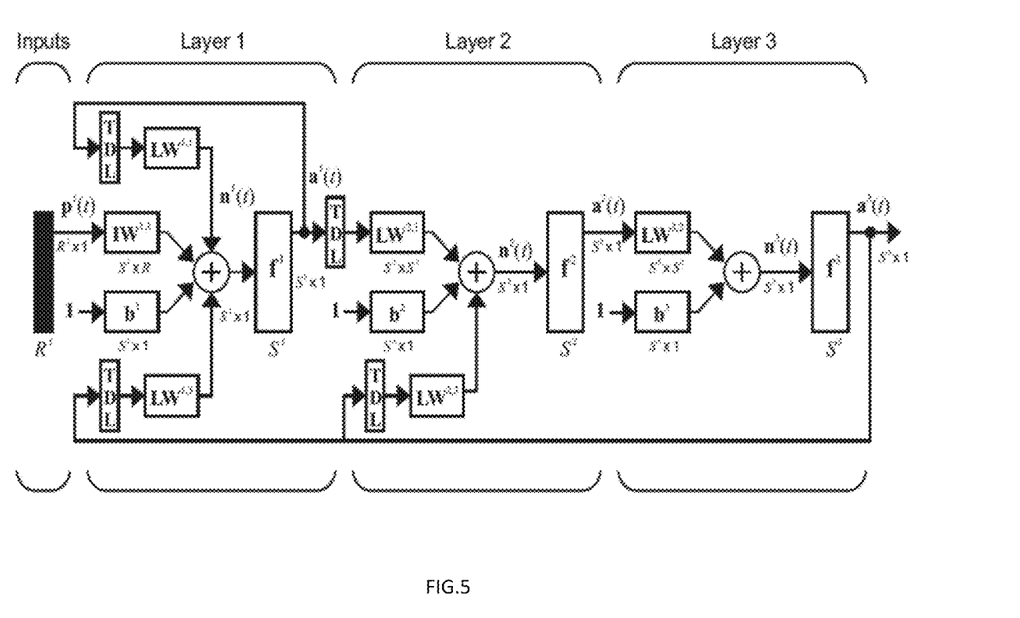
FIG. 5 shows a three-layer LDDN network.

The model is calibrated continuously from each sub-basin in particular and its surroundings using adjustment algorithms through adaptive filters with measured data, as shown in FIGS. 4 and 5 and further described in more detail to follow.

Given that this is an AI and Machine Learning system, the response time and accuracy of the results improve through use and learning as more experience is acquired.

Figure 2:
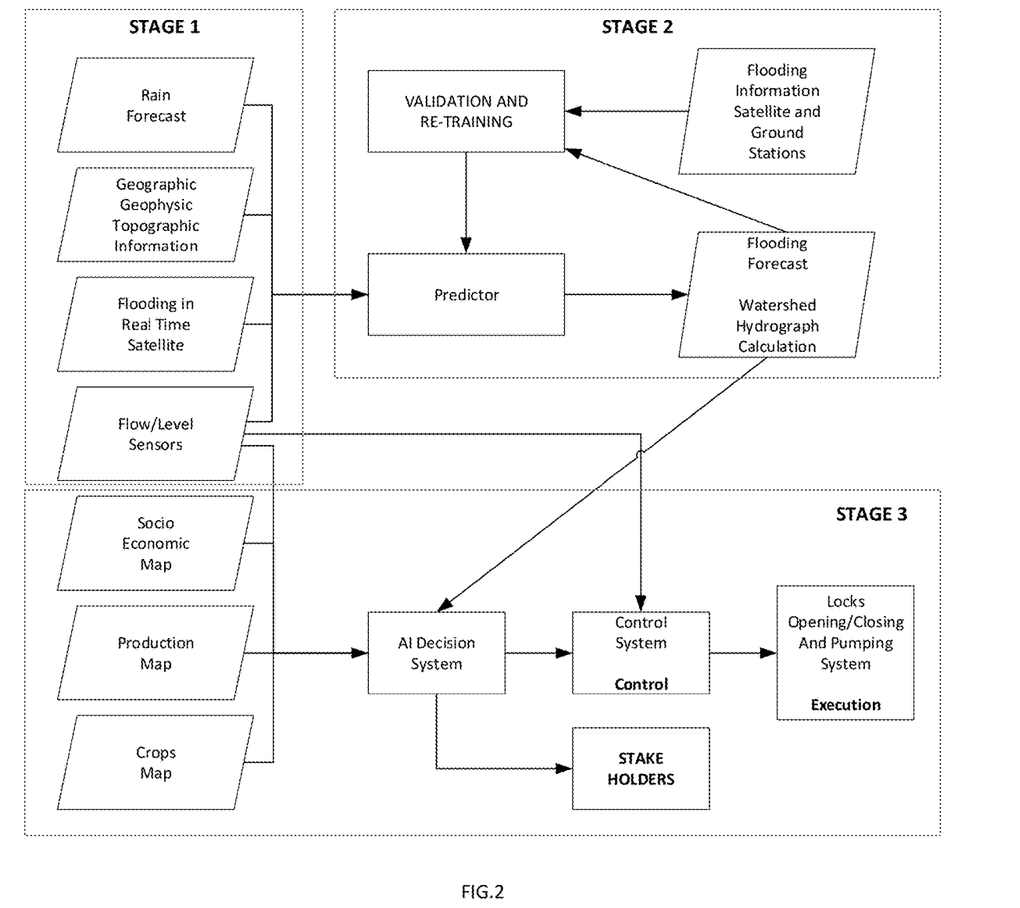
FIG. 2 is a simplified flow diagram showing the different stages of the asserted process.

The process of hydrology analysis and management in its preferred execution consists of three fundamental stages for its development, as it is shown in the simplified diagram in FIG. 2.

The first stage involves the measurement and survey of historical data; in the second stage we differentiate among predictive systems using machine learning methods and hydrology modeling. These predictions need to be validated using the information gathered by the streams flow and reservoir levels monitoring stations. The third stage creates mitigation strategies to minimize the impact of the meteorological event on the basis of the information gathered by the predictive sub-module and its continuous validation, added to the watershed productive socio-economic data, all dynamically gathered.

There follows a detailed description of each one of the stages based on the preferred mode of execution of the invention.

Figure 1:
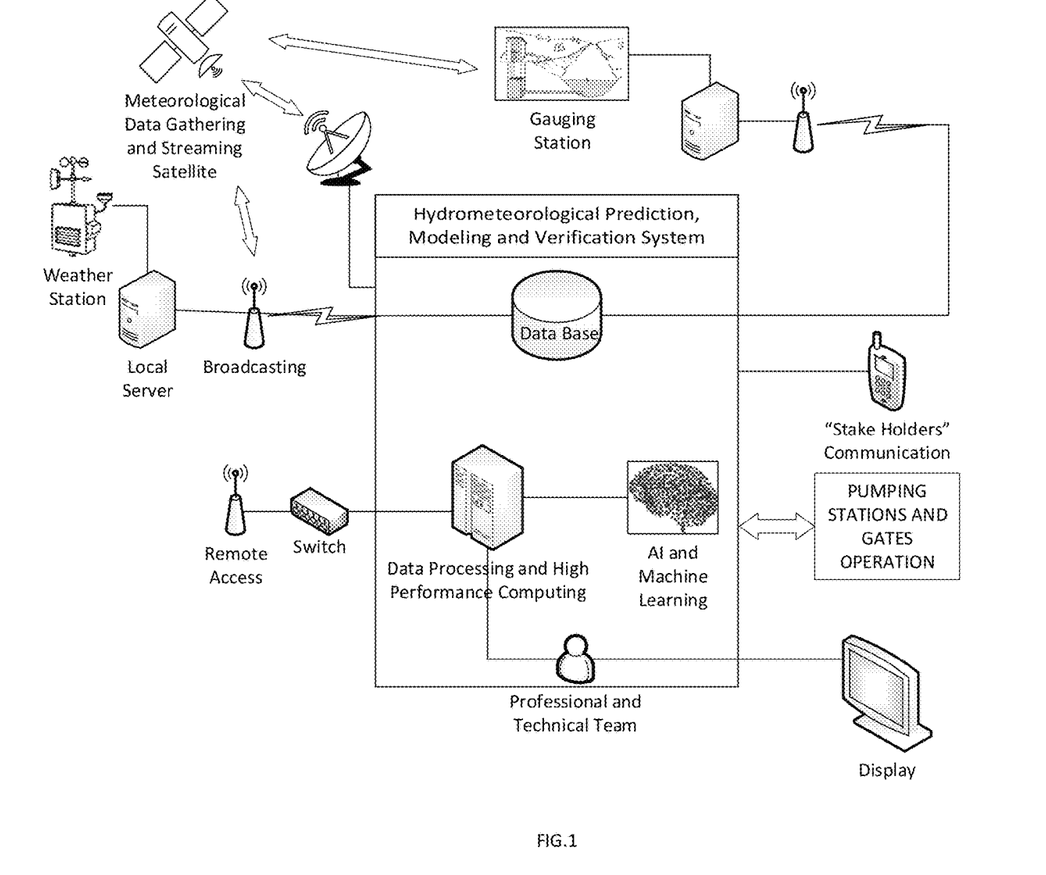
FIG. 1 is a basic schematic of the invention mainly showing collection and data management.

This first stage of the process measures and surveys historical data, such as the description of the watershed, emphasizing the logistics of data management and monitoring stations distribution. Continuous support must guarantee the on-line operation of this first stage, which feeds subsequent ones, reason why its importance in the collective operation of the process is essential. A schematic of this first stage is shown in FIG. 1.

Weather stations with data acquisition and on-line data transmission capabilities through satellite which communicate with the Acquisition Center and Database arranged in the watershed and in areas that contribute to it. Some of the sensors involved in the system are:

Sensor 1: Rain gage.
Sensor 2: Evapotranspiration sensor.
Sensor 3: Wind velocity.
Sensor 4: Atmospheric and soil humidity.
Sensor 5: Temperature.
Sensor 6: Flowmeters in rivers and streams.
Sensor 7: Water level of pondage, dams, rivers and streams.
Sensor 8: Infiltration and seepage.

Another input to the database is satellite information, which is obtained through a tool with automatic access to the server or database of the entity that provides the service. These satellite data are used to visualize the overall watershed state, to estimate flooded areas, drought areas, and tracing and description of storms. They also allow classifying crops to estimate the degree of water consumption based on their characteristics.

Some satellite data are images. Two types of satellite images can be used:
SAR (Synthetic Aperture Radar) images: to monitor a flooded area, and
RGB and Multispectral images: to calculate the green index, crop classification, etc.

In the second stage of the process of hydrology analysis and management, according to the preferred mode of execution of the invention, we differentiate among predictive systems using machine learning methods and hydrology modelling. Predictions are validated by the information gathered on riverbeds flow and reservoir levels by monitoring stations.

Figure 3:
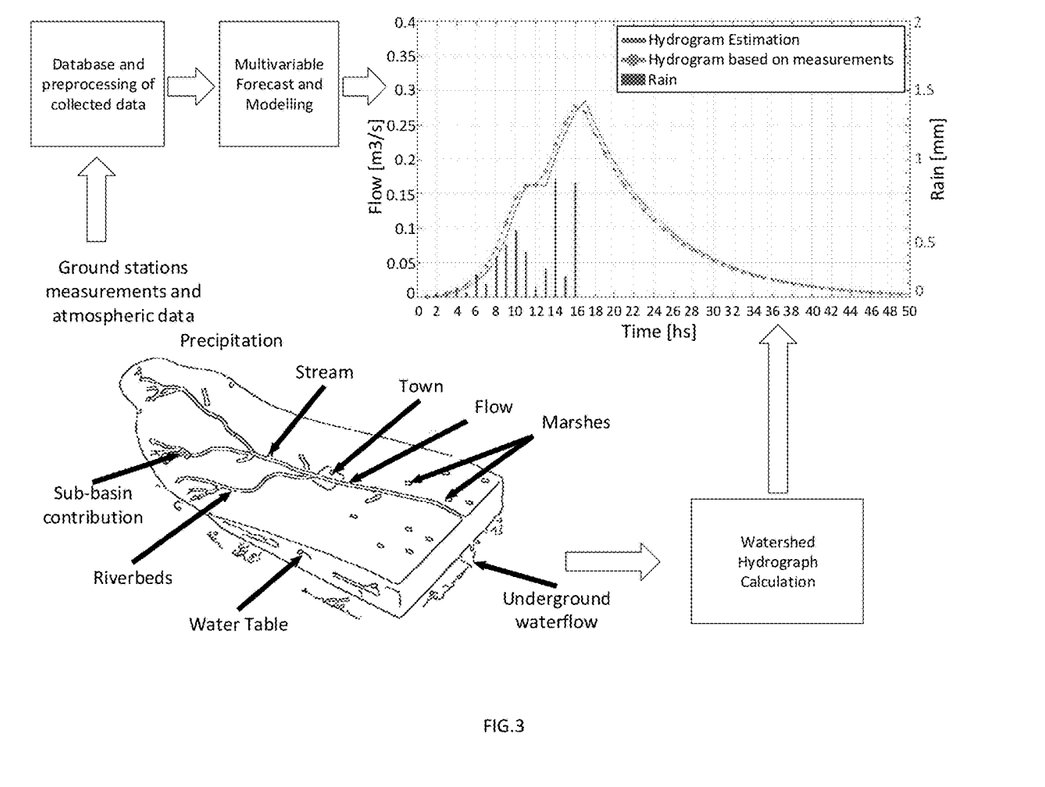
FIG. 3 depicts a simplified scheme of hydrograph generation as input variables to the management subsystem.

In this second stage of the process, the operation of the predictive module or predictor is fundamental as shown by the components depicted in FIG. 3.

The predictive module entails training a dynamic Artificial Neural Network to generate predictions of possible flooded areas. This type of networks of recurrent topology use the pre-processed data gathered on ground stations, satellites, radars, and information from distributed meteorological systems, as well as the predictions of the network performed in prior cases. Dynamic networks are usually more powerful than static networks (which have a higher degree of difficulty regarding training). Since they have memory, dynamic networks can be trained to learn sequential patterns or time variations. This characteristic can be applied to different areas, such as financial markets predictions, communication channels equalization, phase detection in power systems, failure detection, language recognition and meteorological prediction, among others.

To predict a temporal pattern, an artificial neural network requires two distinctive components: a memory and a combiner.

The memory is generated by a delayed time unit (shift register) which constitutes the tapped delay line (TDL) and stores past relevant information used to improve predictions.

The combiner works with a multi-layered perceptron-type network efficient for static, complex and non-linear mapping. A network topology that complies with the above is called Layered Digital Dynamic Network (LDDN). In the case of application in Villa Allende—Córdoba—Argentina, the dynamic information comes from the hydrometeorological stations deployed on the ground, satellite information and the historical statistical analysis of events that occurred in the same location. Each layer of this network is composed of the following parts:

A set of synaptic weight matrices that enter the layer (which can interconnect from other layers or external inputs), combination rules for the weighted functions used to combine the weight matrices with the inputs and associated TDL. The combination is done through the identification of main indicators, such as population density, road design, topography, vegetation on the ground, historical analysis of storms in the region.

An influence-bias vector.

Rules for the network input functions used to combine the weighted functions outputs with the bias vector to generate the input to the network, and A transfer function.

An example of an LDDN FIG. 5 depicts a multilayered network can be seen, where a structure of a three-layered network is shown, where the variable LW means the weight on the hidden layers, IW is the weight on the input layer, B represents the bias unit and f is the transfer function among layers.

Therefore, as many networks as areas in which a forecast is desired may be required. Each network must be trained with variables available of the area and with the previously surveyed data, determining the existence or not of flooded land along with its level of water.

The use of complex computational physical models of the basin's dynamic behavior serves as a training tool for the predictive system. The multi-variable model optimized with the collected experience allows the training of the predictor on cases not previously registered, allowing a fast response time due to the quick processing of the neural networks. In this way, the integral predictive tool includes the computing times of the physical model and of the network self-training.

Finally, in the third stage of the hydrology analysis and management process, according to the preferred mode of execution of the invention, mitigation strategies are generated to minimize the impact of the meteorological event depending on the information collected by the predictive submodule and its constant validation, added to the basin's socioeconomic productive data, dynamically gathered.

The entire analysis process is based on a Geographical Information System (GIS) that uses as input the outcome of the flooding forecast geographically divided in cells. Each cell has the information of the water level in each evaluation area. In this way, the event is analyzed in layers (rasters), which when considered together, identify the problem areas and projected areas.

The evaluation layers of each cell have an incidence weight value. For example, if the layer represents population density, the agricultural area weight value may be close to zero. As urban complexity increases or population density increases, the number of cells is greater. Additionally, and depending on the incidence of the weight that each layer may have, it may be the relevance that may be given in the event as a level of information.

Figure 6:
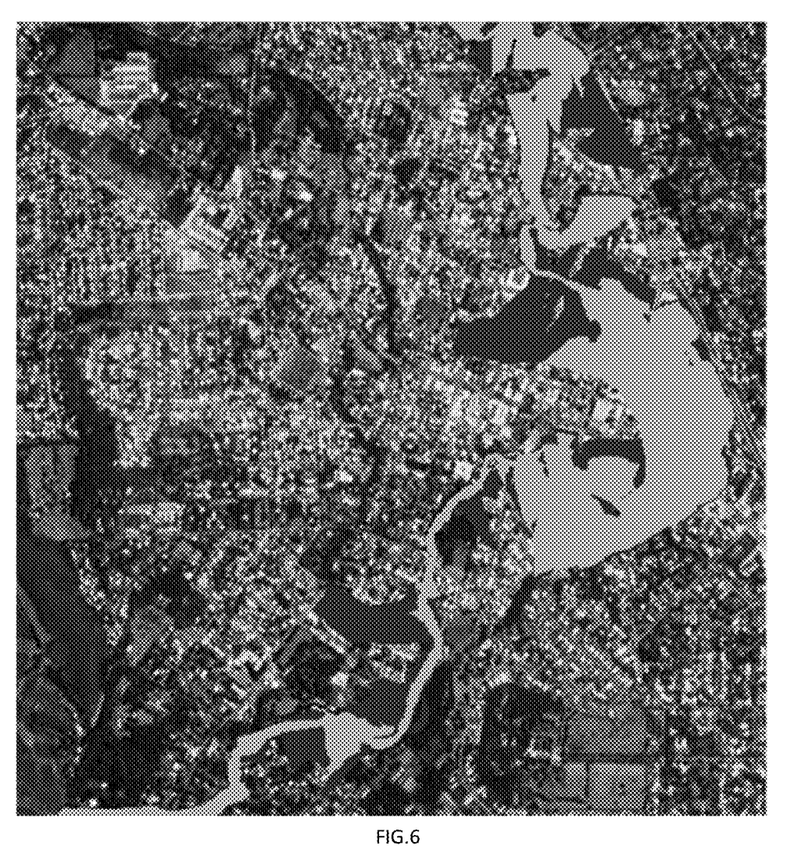
FIG. 6 is an example of a flooding map as a result of the forecast of the artificial neural network.
Figure 7:
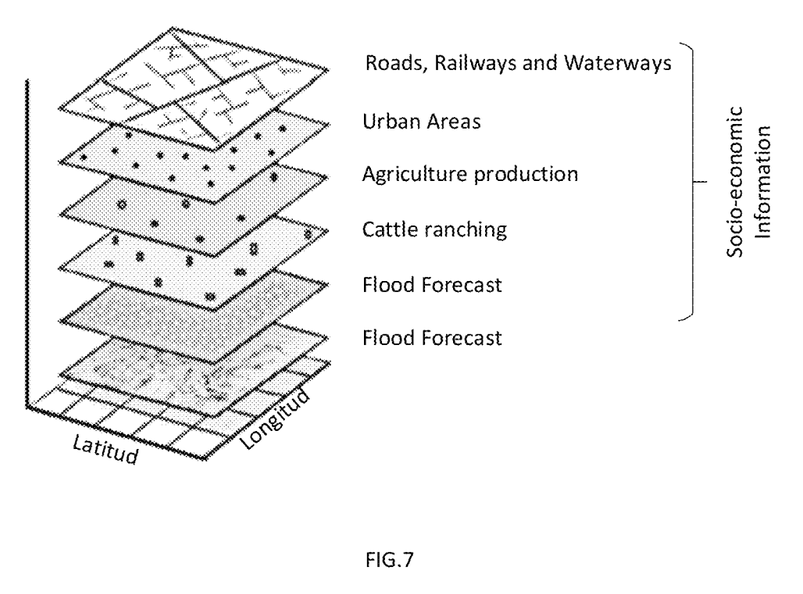
FIG. 7 is a layered input to the decision-making system assisted by Artificial Intelligence.

In this manner, each layer may be analyzed weighted by a coefficient related to socio-economic priorities, as depicted in FIG. 7 by examplar layers of socio-economic information associated with a geographic area as shown in FIG. 6.

Figure 8:
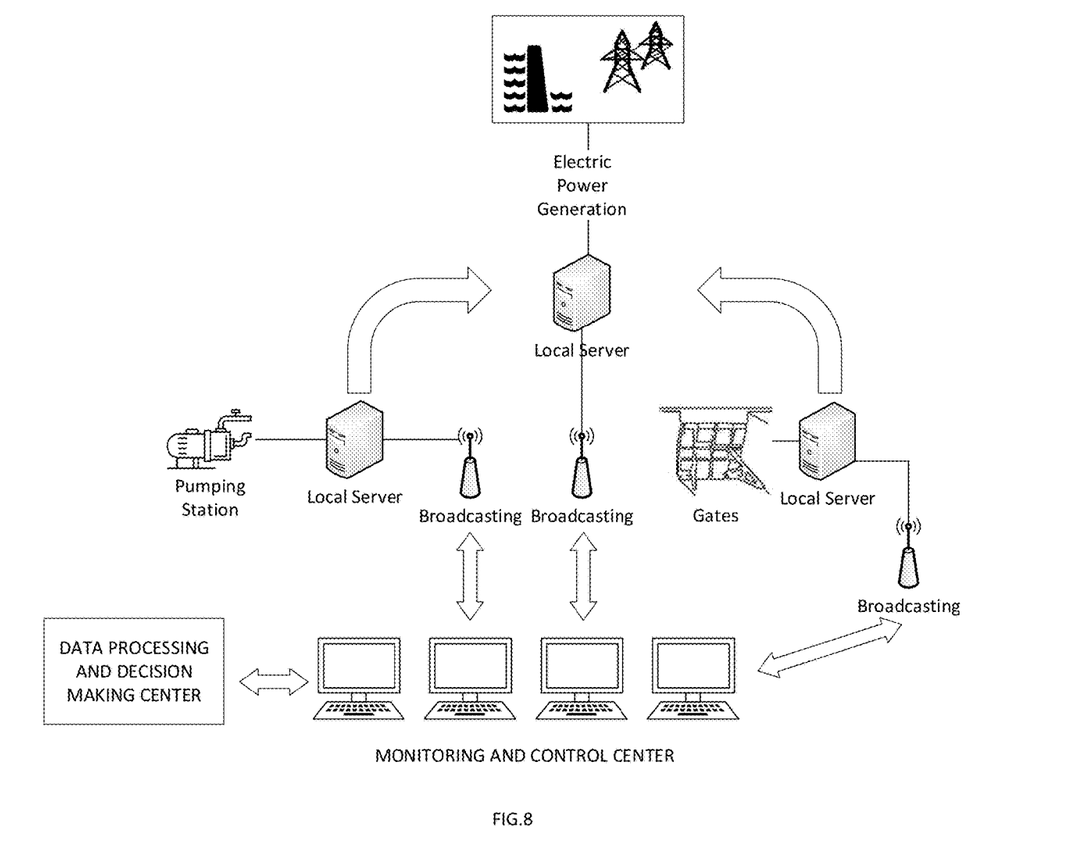
FIG. 8 represents a structure that reveals the stages and combination of means for water volume management based on the asserted invention.

The AI-assisted decision module with Multi-Criteria Decision Analysis (MCDA) vector optimization algorithms is in charge of finding flooding areas that minimize socio-economic impacts on the basin. This decision module as shown in FIG. 5, includes a multitasking distributed computer center as depicted in FIG. 8.

The results obtained from the calculations in a unique raster with water levels derived from the combination of all other input information sources. With this result, the decision module performs the simulation of the operation of locks and pumps needed for the basin to achieve the required state within a determined timeframe.

Once it has been determined which water volumes are to be moved and where, the operation report is generated in a control room from where the actuation of the locks and pumping stations available for drainage control are executed and monitored in order to achieve flood control in accordance with the protection criteria chosen.

The control room follows a normalized standard based on international safety and reliability standards for man-machine interface. In the preferred mode of execution, the control room includes three sectors to be determined depending on the application, but always keeping with the strictest safety standards.

One sector is the supply of normal line energy and backup energy or uninterrupted support to the battery pack. The second sector is the air-conditioning equipment room for environment adjustment depending on the equipment used and the local conditions; and the third sector includes two parts: the system operation room, which is subdivided into visualization and on-line calculations (algorithmic and modelled) and the server room, which includes the communication system.

In said control and decision-making room, all information will be available online in order to make decisions quickly.

In this way, the main objective is focused on:

Protect urban areas.

Protect the most productive areas.

Protect the best soils, the most productive areas and strategic locations of the basin.

Store water in non-productive areas in order to use it for irrigation purposes in future droughts.

An additional advantage of this invention is that the management of available hydrological resources allows obtaining a strategically important byproduct, i.e. electrical generation, using, as an example, advanced converter systems such as low speed generators and run-of-the-river turbines.

The resolution of the process launched by the system based on the preferred mode of execution of the invention consists in the analysis of a mass balance originated by the inflow, outflow, and pondage in each study cell into which the system is divided. Thus, in each cell's domain, the system solves the following equation:

$$V_I^i = V_E^i + V_R^i$$

where, i is the cell number that corresponds to the adopted subdivision of the system $V_I^i$ is the incoming volume in each cell i $V_E^i$ is the outgoing volume in each cell i $V_R^i$ is the pondage or retained volume in each cell i The choice of number and surface of each study cell is defined as a function of the accuracy needed for the variables to be determined in each sector of the system. Therefore, each system may be divided in larger or smaller cells depending on the economic, social, and environmental importance of each study area.

The incoming volume $V_I^i$ is determined by vertical and horizontal contributions. The main vertical contribution is precipitation, while the horizontal one corresponds to the outgoing volume $V^{i+n}$ of the adjacent cells, which is originated by surface horizontal runoff and groundwater flow.

Therefore, $$V_I^i = V_{IP} + V_{ES}^{i+n} V_{RSU}^{i+n}$$

where, $V_{IP}$ is the incoming flow due to precipitation $V_{ES}^{i+n}$ is the superficial volume that enters study cell "i" incoming from cell "i+n" adjacent to the one under study $V_{RSU}^{i+n}$ is the groundflow water that enters study cell "i" incoming from cell "i+n" adjacent to the one under study The outgoing volume $V_{ES}^{i+n}$ of each cell originates in outgoing volumes both vertically and horizontally.

The vertical volumes are those originated by the evaporation of liquid surfaces due to solar radiation and temperature (mm/time), evapotranspiration (depending on natural vegetation or crops), and infiltration (which is variable depending on the type of soil and degree of saturation and water table level of the existing lot in each study cell).

On the other hand, the horizontal volumes are determined by the outgoing volume within a certain period of time (flow) that can be transferred towards adjacent cells through natural or artificial channels.

The difference between incoming $V_I^i$ volume and outgoing $V_{ES}^i$ volume of each cell can either be positive or negative. If it is positive, i.e. the incoming volume is larger than the outgoing volume, it creates a pondage or retained volume $V_R^i$ in the study cell, which can be stored or dammed in a controlled manner through natural or artificial reservoirs or in an uncontrolled manner, producing undesired flooding in areas of the cell.

The stored volume can be slowly reduced by releases from artificial reservoirs, i.e. by opening locks and discharge valves or through pump stations located in natural reservoirs for that purpose, thereby distributing along time the outflow of each cell for the purpose of relieving or avoiding flooding in cells located downstream.

If the difference is negative, i.e. the outgoing volume $V_E^i$ is larger than the incoming volume $V_I^i$ during times of scarce precipitation, the volume stored in natural and artificial reservoirs, both on the surface and underground, can be used to try to stabilize the equation and ameliorate periods of drought. Management of the water volumes in the different reservoirs is achieved by operating available pumps and locks interconnected in the basin.

The above description includes examples of one or more means of operation. Obviously, each of the combinations of possible components or methodologies cannot be described for the purpose of explaining the execution previously addressed, but a properly trained person can recognize that many other operational combinations and permutations are possible. Thus, the manner of operation described is destined to encompass all the alterations, modifications and variations that lie within the scope of the assertions that follow.

The present disclosure provides, generally, computer systems that are programmed to implement the methods and systems described herein. The computer systems include central processing units (e.g., processors), which can be a single core or multi core processor, or a plurality of processors for parallel processing. The computer systems may include memory (e.g., random-access memory, read-only memory, flash memory), electronic storage units (e.g., hard disk, static RAM, memory stick, SDRAM modules), communication interfaces (e.g., network adapters, wireless adapters) for communicating with one or more other systems, and peripheral devices, such as cache, other memory, data storage and/or electronic display adapters.

The memory, storage units, interfaces, and peripheral devices are known to be communications with the CPU processors through communication buses, which may be a motherboard or a backplane of an electronic user device. Storage memory may be a data storage unit or data repository such as an RDMS database for storing data. Computer systems may be operatively coupled to a computer network ("network") with the aid of a communication interface.

The networks may be the Internet, an internet and/or extranet, Ethernet, WIFI, WLAN, or an intranet and/or extranet in communication with the Internet. The networks may in some cases be a telecommunication, satellite and/or data network. The networks can include one or more computer servers, which can enable distributed computing, such as cloud computing. Computer systems may communicate with one or more remote computer systems through the network with a remote computer system.

Processors of the computer systems of the present invention may execute a sequence of machine-readable instructions, which can be embodied in a program or software. The instructions may be stored in a memory location. The instructions can be directed to the processor, which can subsequently program or otherwise configure the processor to implement methods of the present disclosure. Processors may be part of a circuit, such as an integrated circuit and one or more other components or modules of the computer systems may be included in a circuit, for example, in some cases, the circuits may be an application specific integrated circuit (ASIC).

Storage units may store files, such as drivers, libraries and saved programs. Storage units may store user data, e.g., user preferences and user programs. Computer systems may in some cases include one or more additional data storage units that are external to the computer systems, such as located on a remote server that is in communication with the computer systems through an intranet or the Internet or other data communications link.

Methods as described herein may be implemented by way of machine (e.g., CPU, processor) executable code stored on an electronic storage location of the computer system, such as, for example, on the memory or other electronic storage unit. Machine executable or machine-readable code may be provided in the form of software. During use, the code may be executed by the processor, retrieved from the storage unit and stored on the memory for ready access by the processor. In some situations, machine-executable instructions may be stored directly to memory. Computer codes may be precompiled and configured for use with a machine have a processer adapted to execute the code or can be compiled during runtime. The code can be supplied in a programming language that can be selected to enable the code to execute in a pre-compiled or as compiled fashion.

As described herein, various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software.

As used herein, unless restricted to non-transitory, tangible "storage" media, terms such as computer or machine "readable medium" refer to any medium that participates in providing instructions to a processor for execution. Machine readable medium may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications.

Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system can include or be in communication with an electronic display that comprises a user interface (UI) for providing, for example, user interfaces associated with the multitasking distributed computer center of the present invention. Examples of UI's include, without limitation, a graphical user interface (GUI) and web-based user interface. Methods and systems of the present disclosure can be implemented by way of one or more algorithms. An algorithm can be implemented by way of software upon execution by a CPU/processor.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A staged neural network apparatus for adaptive prediction and mitigation of hydrometeorological events in river basins, the apparatus comprising:
    a memory and a processor, the memory storing instructions for execution by a processor, the instructions configured to perform by the processor the steps of:
        receiving historical hydrological data, meteorological data and geological data, including precipitation data, infiltration data, and surface runoff data from sensor measurement information on flood areas, flood levels of riverbeds, retained and released volumes of water flows of a basin area;
        receiving geological, agricultural, and urban usage information on areas within the basin area;
        training a multi-stage artificial neural network (ANN) with the received historical data and the received geological, agricultural, and urban usage information;
        predicting, by the ANN, sub-basin hydrographs of flood events from hydrometeorological events in sub-basin areas of the basin area;
        receiving in real-time hydrological and meteorological data, including precipitation data, infiltration data, and surface runoff data from sensor measurement information on flood areas, flood levels of riverbeds, retained and released volumes of water flows of the basin area;
        determining a mass balance from predicted incoming and outgoing flow volumes in each of one or more study cells dividing the basin area such that water volumes may be directed to achieve flood control in accordance with sub-basin protection criteria;
        determining control instructions for controlling the opening and closing of water control facilities based on the determined mass balance of the one or more study cells and the sub-basin protection criteria for the mitigation of impacts of hydrometeorological events based on the geological, agricultural, and urban usage information within the basin area; and
        retraining the ANN with historical and real-time hydrological data, meteorological data and geological data based on sensor measurement information on flood areas, flood levels of riverbeds, retained and released volumes of water flows of a basin area based on the controlling of the water control facilities;
        wherein the determining of control instructions for controlling the opening and closing of water control facilities includes the steps of:
        determining mitigation strategies by simulating the operation of locks and pumps needed for the basin to achieve mitigation and/or flood prevention in a certain period of time;
        determining water volumes that should be released and their direction to control flooding based on selected protection criteria, and
        preparing an operating report sending it online to the water control facilities from where the actuation of the locks and pumping stations available for drainage control is directed and executed.

2. The apparatus of claim 1, wherein the step of receiving historical data, meteorological data and geological data includes receiving data from one or more of: rain gauges, evapotranspiration gauges, wind speed sensors, ambient and soil humidity sensors, temperature sensors, flowmeters in rivers and streams, water level in ponds, reservoirs, rivers and streams, and infiltration and percolation sensors installed in the weather stations.

3. The apparatus of claim 1, wherein the multi-stage artificial neural network (ANN) comprises a memory and a combiner, wherein said memory is generated by a unit of delayed time (shift register) which constitutes the tapped delay line (TDL) and stores past relevant information to improve predictions, and wherein the combiner is a perceptron-type multi-layered network.

4. The apparatus of claim 3, wherein at least one network layer of the ANN includes at least one set of synaptic weight matrices that enter the layer, combination rules for the weighted functions used to combine the weight matrices with the inputs and associated TDL, an influence-bias vector, rules for the network input functions used to combine the weighted functions outputs with the bias vector to generate the input to the network, and a transfer function.

5. The apparatus of claim 4, wherein the predictive module is configured to be trained through a multi-variable model.

6. The apparatus of claim 5, wherein predicting sub-basin hydrographs of flood events from hydrometeorological events in sub-basin areas includes predicting a basin mapping with flooding forecast and calculating the hydrograph of the sub basin under study using topographical data; and further includes validating calculated flows for the entire chain of flow measuring points in key areas for updating the predictive model and the at least one network layer to improve future predictions.

7. The apparatus of claim 1, wherein the determining of control instructions for controlling the opening and closing of water control facilities further includes the steps of:

evaluating geographical information system data that divides area under evaluation into cells based on the flooding forecast and the information of water level present in that area;

analyzing of the event through superimposed layers with different incidence weighing values for each of them determined by socio-economic information;

determining a single layer with water levels derived from the superimposition of remaining analyzed layers that minimize the socio-economic impact on the basin through an assisted decision-making module comprising an MCDA vectorial optimization algorithm.

8. The apparatus of claim 7, wherein the step of determining mitigation strategies includes:

analyzing a mass balance originated by the incoming volume of water, outflowing volume, and poundage in each study cell into which the evaluation area has been subdivided, where the domain of each of the cells is solved using the following equation:

$$V_I^i = V_E^i + V_R^i$$

where i is the cell number that corresponds to the adopted subdivision of the system; $V_I^i$ is the incoming volume in each cell i; $V_E^i$ is the outgoing volume in each cell i; $V_R^i$ is the pondage or retained volume in each cell i.

9. The apparatus of claim 8, wherein the incoming volume is calculated using the following equation:

$$V_I^i = V_{IP} + V_{ES}^{i+n} V_{RSU}^{i+n}$$

where $V_{IP}$ is the incoming flow due to precipitation; $V_{ES}^{i+n}$ is the superficial volume that enters study cell "i" incoming from cell "i+n" adjacent to the one under study; $V_{RSU}^{i+n}$ is the groundflow water that enters study cell "i" incoming from cell "i+n" adjacent to the one under study.

10. The apparatus of claim 8, wherein the outgoing volume $V_E^i$ of each cell originates in outgoing volumes both vertically and horizontally, in which the vertical volumes are those originated by the evaporation of liquid surfaces due to solar radiation and temperature, evapotranspiration and infiltration; while the horizontal volumes are determined by the outgoing volumes possible of being directed to adjacent cells through natural or artificial channels and within a certain period of time.

* * * * *